United States Patent
Mueller et al.

(10) Patent No.: US 6,313,663 B1
(45) Date of Patent: Nov. 6, 2001

(54) FULL SWING VOLTAGE INPUT/FULL SWING OUTPUT BI-DIRECTIONAL REPEATERS FOR HIGH RESISTANCE OR HIGH CAPACITANCE BI-DIRECTIONAL SIGNAL LINES AND METHODS THEREFOR

(75) Inventors: Gerhard Mueller, Wappingers Falls; David R. Hanson, Brewster, both of NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/491,635

(22) Filed: Jan. 27, 2000

Related U.S. Application Data

(63) Continuation-in-part of application No. 09/037,289, filed on Mar. 9, 1998, now Pat. No. 6,181,165.

(51) Int. Cl.$^7$ ............................................. H03K 19/0185
(52) U.S. Cl. .............................. 326/83; 326/86; 326/58; 370/274; 370/279; 375/211
(58) Field of Search ........................... 326/21, 30, 56–58, 326/83, 86, 87; 375/211; 370/274, 279, 293, 315, 492

(56) References Cited

U.S. PATENT DOCUMENTS

| | | | |
|---|---|---|---|
| 5,179,299 | * 1/1993 | Tipon | 307/443 |
| 5,202,593 | * 4/1993 | Huang et al. | 307/475 |
| 5,218,240 | * 6/1993 | Camarota et al. | 307/443 |
| 5,801,549 | * 9/1998 | Cao et al. | 326/83 |
| 6,137,167 | * 10/2000 | Ahn et al. | 257/691 |

* cited by examiner

Primary Examiner—Michael Tokar
Assistant Examiner—Vibol Tan
(74) Attorney, Agent, or Firm—Stanton C. Braden

(57) ABSTRACT

A bidirectional full swing voltage repeater implemented on a signal line of an integrated circuit, which includes a first enable node for providing a first enable signal and a second enable node for providing a second enable signal. There is included a first full-swing unidirectional repeater circuit coupled between a first portion of the signal line and a second portion of the signal line. The first full-swing unidirectional repeater is configured to pass a first full swing signal from the first portion of the signal line to the second portion of the signal line when the first enable signal is enabled. The second full-swing unidirectional repeater circuit is coupled between the first portion of the signal line and the second portion of the signal line. The second full-swing unidirectional repeater circuit is configured to pass a second full swing signal from the second portion of the signal line to the first portion of the signal line when the second enable signal is enabled, wherein the first full-swing unidirectional repeater circuit and the second full-swing unidirectional repeater circuit are tri-stated when both the first enable signal and the second enable signal are disabled.

20 Claims, 8 Drawing Sheets

FULL SWING VOLTAGE INPUT/FULL SWING OUTPUT BI-DIRECTIONAL REPEATERS FOR HIGH RESISTANCE OR HIGH CAPACITANCE BI-DIRECTIONAL SIGNAL LINES AND METHODS THEREFOR

This application is a continuation in part of U.S. patent application Ser. No. 09/037,289 entitled "Full voltage input/full voltage output tri-state buffers and methods therefor," filed Mar. 9, 1998 now U.S. Pat. No. 6,181,165, which is incorporated herein by reference.

RELATED APPLICATIONS

This application is related to the following applications, which are filed on the same date herewith and incorporated herein by reference:

Application entitled "REDUCED VOLTAGE INPUT/REDUCED VOLTAGE OUTPUT REPEATERS FOR HIGH RESISTANCE OR HIGH CAPACITANCE SIGNAL LINES AND METHODS THEREFOR" filed by inventors Gerhard Mueller and David R. Hanson on the same date.

Application entitled "FULL SWING VOLTAGE INPUT/FULL SWING VOLTAGE OUTPUT BI-DIRECTIONAL REPEATERS FOR HIGH RESISTANCE OR HIGH CAPACITANCE BI-DIRECTIONAL SIGNAL LINES AND METHODS THEREFOR" filed by inventors Gerhard Mueller and David R. Hanson on the same date.

BACKGROUND OF THE INVENTION

The present invention relates to repeater circuits for high resistance and/or high capacitance signal lines on an integrated circuit. More particularly, the present invention relates to full swing voltage repeaters which, when employed on a high resistance and/or high capacitance bi-directional signal line facilitate propagation of signals in both directions while significantly reducing the signal propagation delay and/or signal degradation.

In some integrated circuits, there exist signal lines that span long distances and/or are coupled to many circuits. In modern dynamic random access memory circuits, for example, certain unidirectional signal lines such as address lines may be coupled to many circuits and may therefore have a high capacitive load and/or resistance associated therewith. Likewise, certain bi-directional lines such as read write data (RWD) lines may also be coupled to many circuits and may therefore also have a high capacitive load and/or resistance associated therewith. The problem of high capacitive load and/or resistance also arises for many signal lines in modern microprocessors, digital signal processors, or the like. By way of example, the same issue may be seen with loaded read data lines and write data lines of memory circuits, clock lines of an integrated circuit, command lines, and/or any loaded signal carrying conductor of an integrated circuit. The propagation delay times for these signal lines, if left unremedied, may be unduly high for optimal circuit performance.

To facilitate discussion, FIG. 1 illustrates an exemplary signal line 100, representing a signal conductor that may be found in a typical integrated circuit. Signal line 100 includes resistors 102 and 104, representing the distributed resistance associated with signal line 100. Resistors 102 and 104 have values that vary with, among others, the length of signal line 100. There are also shown capacitors 106 and 108, representing the distributed capacitance loads associated with the wire or signal bus and the circuits coupled to signal line 100.

The resistance and capacitance associated with signal line 100 contribute significantly to a signal propagation delay between an input 110 and an output 112. As discussed in a reference entitled "Principles of CMOS VLSI design: A Systems Perspective" by Neil Weste and Kamran Eshraghian, 2nd ed. (1992), the propagation delay of a typical signal line may be approximately represented by the equation $$t_{delay} = 0.7(RC)(n)(n+1)/2 \qquad \text{Eq. 1}$$

wherein n equals the number of sections, R equals the resistance value, C equals the capacitance value. For the signal line of FIG. 1, the propagation delay is therefore approximately 2.1 RC (for n=2).

If the resistance value (R) and/or the capacitance value (C) is high, the propagation delay with signal line 100 may be significantly large and may unduly affect the performance of the integrated circuit on which signal line 100 is implemented. For this reason, repeaters are often employed in such signal lines to reduce the propagation delay.

FIG. 2 depicts a signal line 200, representing a signal line having thereon a unidirectional repeater to reduce its propagation delay for signals travelling from left to right. Signal line 200 is essentially signal line 100 of FIG. 1 with the addition of a repeater 202 disposed between an input 210 and an output 212. In the example of FIG. 2, unidirectional repeater 202 is implemented by a pair of cascaded CMOS inverter gates 204 and 206 as shown. For ease of discussion, unidirectional repeater 202 is disposed such that it essentially halves the distributed resistance and capacitance of unidirectional signal line 200.

In this case, the application of Eq. 1 yields a propagation delay of $0.7(RC) + t_{DPS} + t_{DPS} + 0.7(RC)$ or $1.4(RC) + 2t_{DPS}$, wherein $t_{DPS}$ represents the time delay per inverter stage. Since $t_{DPS}$ may be made very small (e.g., typically 150 ps or less in most cases), the use of unidirectional repeater 202 substantially reduces the propagation delay of the signals traveling from node 210 to 212 (from left to right) on the unidirectional signal line 200, particularly when the delay associated with the value of R and/or C is relatively large compared to the value of $t_{DPS}$.

The use of unidirectional repeaters such as 202 prove to be useful in reducing the propagation delay on unidirectional signal lines where signals need to propagate only in one direction. A unidirectional repeater, however, fails to function on a bi-directional line where signals need to propagate in both directions between two given nodes. Bi-directional signal lines are required for application such as bi-directional read write (RWD) of dynamic random access memory integrated circuits ( DRAM Ics). Moreover, a bi-directional repeater would be very beneficial for bi-directional applications such as RWD lines because of the long propagation delay typically associated with these applications.

One major difficulty associated with implementation of a bi-directional repeater relates to the problem of timing the propagation of signals. This difficulty is even more problematic for applications such as bi-directional RWD where signals typically have to propagate a long distance in a chip. In such applications, the proper timing of enable control signals to allow proper propagation of signals in both directions is essential. For example, these enable control signals would be enable read and enable write control signals for bi-directional RWD applications.

As can be appreciated from the foregoing, there is a desire for techniques for implementing bi-directional full swing voltage repeaters on the high resistance and/or high capacitance bidirectional signal lines of an integrated circuit.

SUMMARY OF THE INVENTION

The invention relates, in one embodiment, to a bidirectional full swing voltage repeater implemented on a signal line of an integrated circuit, which includes a first enable node for providing a first enable signal and a second enable node for providing a second enable signal. There is included a first full-swing unidirectional repeater circuit coupled between a first portion of the signal line and a second portion of the signal line. The first full-swing unidirectional repeater is configured to pass a first full swing signal from the first portion of the signal line to the second portion of the signal line when the first enable signal is enabled. The second full-swing unidirectional repeater circuit is coupled between the first portion of the signal line and the second portion of the signal line. The second full-swing unidirectional repeater circuit is configured to pass a second full swing signal from the second portion of the signal line to the first portion of the signal line when the second enable signal is enabled, wherein the first full-swing unidirectional repeater circuit and the second full-swing unidirectional repeater circuit are tri-stated when both the first enable signal and the second enable signal are disabled.

In another embodiment, the invention relates to a memory integrated circuit having therein a bidirectional full swing voltage repeater implemented on a bidirectional data signal line. The memory integrated circuit includes a first enable node for providing a first enable signal and a second enable node for providing a second enable signal. There is included a first full-swing unidirectional repeater circuit coupled between a first portion of the bidirectional data signal line and a second portion of the bidirectional data signal line. The first full-swing unidirectional repeater is configured to pass a first full swing signal from the first portion of the bidirectional data signal line to the second portion of the bidirectional data signal line when the first enable signal is enabled. There is included a second full-swing unidirectional repeater circuit coupled between the first portion of the bidirectional data signal line and the second portion of the bidirectional data signal line. The second full-swing unidirectional repeater circuit is configured to pass a second full swing signal from the second portion of the bidirectional data signal line to the first portion of the bidirectional data signal line when the second enable signal is enabled, wherein the first full-swing unidirectional repeater circuit and the second full-swing unidirectional repeater circuit are tri-stated when both the first enable signal and the second enable signal are disabled, the first full swing unidirectional repeater circuit is tristated when the second enable signal is enabled, and the second full swing unidirectional repeater circuit being tristated when the first enable signal is enabled.

In yet another embodiment, the invention relates to a method for implementing a bidirectional full swing voltage repeater on a signal line of an integrated circuit. The method includes providing a first enable node that is configured for providing a first enable signal. There is included providing a second enable node that is configured for providing a second enable signal. There is further included providing a first full-swing unidirectional repeater circuit coupled between a first portion of the signal line and a second portion of the signal line. The first full-swing unidirectional repeater is configured to pass a first full swing signal from the first portion of the signal line to the second portion of the signal line when the first enable signal is enabled. There is additionally included providing a second full-swing unidirectional repeater circuit coupled between the first portion of the signal line and the second portion of the signal line. The second full-swing unidirectional repeater circuit is configured to pass a second full swing signal from the second portion of the signal line to the first portion of the signal line when the second enable signal is enabled, wherein the first full-swing unidirectional repeater circuit and the second full-swing unidirectional repeater circuit are tri-stated when both the first enable signal and the second enable signal are disabled.

These and other features of the present invention will be described in more detail below in the detailed description of the invention and in conjunction with the following figures.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known structures and/or process steps have not been described in detail in order to not unnecessarily obscure the present invention.

The invention relates, in one embodiment, to techniques for implementing full swing voltage bi-directional repeaters in integrated circuits. In accordance with one aspect of the present invention, various full swing voltage tri-state buffer configurations are disclosed as being suitable candidates for bidirectional repeater applications.

In accordance with one aspect of the present invention, full swing voltage bi-directional repeaters are employed on high resistance and/or high capacitance bi-directional line(s) of an integrated circuit to reduce the signal propagation delay and/or signal degradation for bi-directional applications such as RWD of DRAM ICS.

The features and advantages of the present invention may be better understood with reference to the figures that follow.

Figure 1:
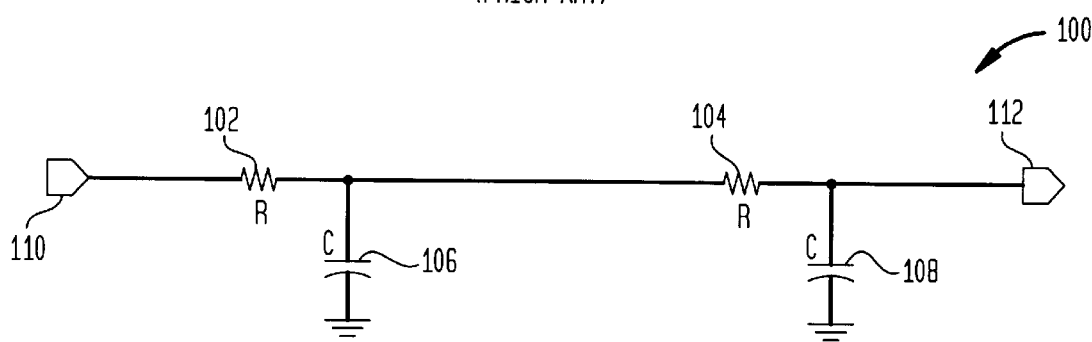
FIG. 1 illustrates an exemplary signal line, representing a signal conductor that may be found in a typical integrated circuit.
Figure 2:
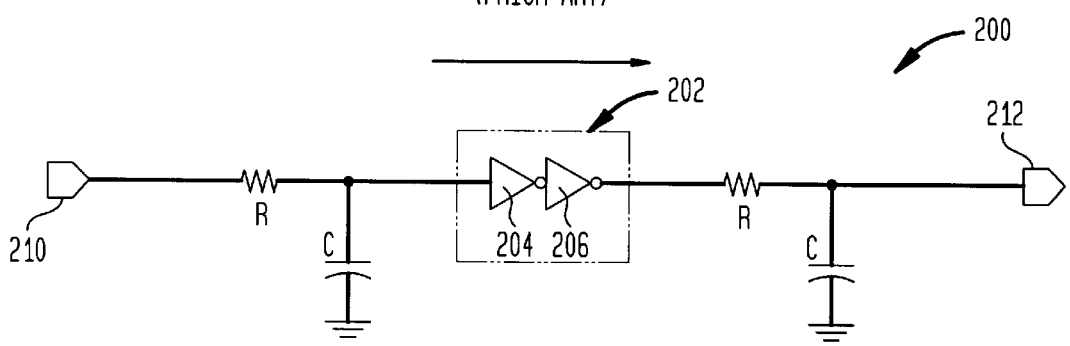
FIG. 2 depicts the signal line of FIG. 1 having thereon a unidirectional repeater to reduce its propagation delay.
Figure 3:
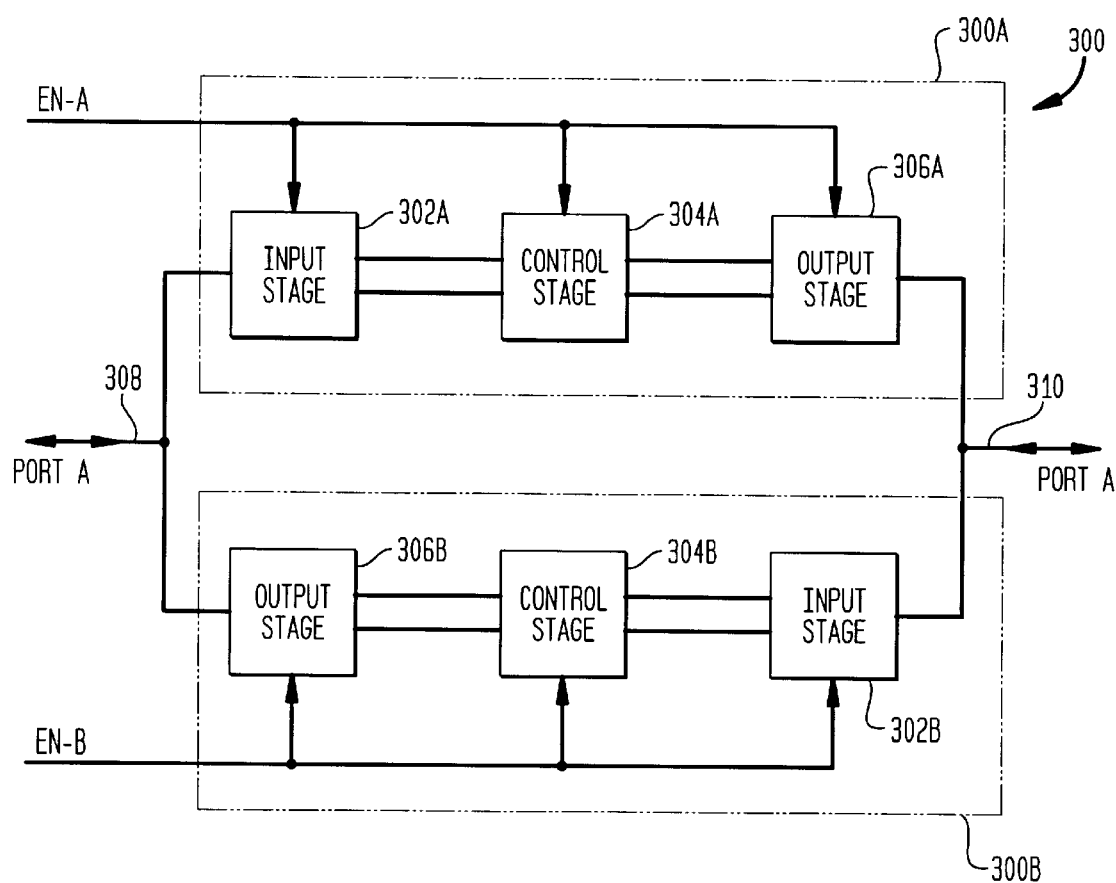
FIG. 3 illustrates, in accordance with one embodiment of the present invention, a simplified full swing voltage bi-directional tri-state buffer circuit, capable of functioning as full swing voltage bi-directional repeater circuit.

FIG. 3 illustrates, in accordance with one embodiment of the present invention, a simplified full swing voltage bidirectional repeater circuit 300, including two tri-state buffers 300A (top portion) and 300B (bottom portion). As shown in FIG. 3, the output of tri-state buffer 300A is coupled to the input of tri-state buffer 300B, forming port A. Likewise, the output of tri-state buffer 300B is coupled to the input of tri-state buffer 300A, forming port B. Tri-state buffers 300A and 300B can be controlled by control signals EN__A and EN__B, which may be complementary signals or both equal to a logic level low (ground). Depending on the states of the control signals, port A may function as either an input port or an output port (with port B functioning as the respective output port or input port). These control signals, which can be coupled to the stages of the two tri-state buffers 300A and 300B, in accordance with techniques of the present invention, allow the bi-directional repeater circuit 300 to be implemented in various bi-directional applications such as RWD bidirectional signal lines of DRAM ICs.

Each simplified tri-state buffer circuit (300A and 300B) includes an input stage 302, a control stage 304, and an output stage 306. Tri-state buffer circuit 300A represents a repeater circuit suitable for use in a unidirectional full swing voltage input/full swing voltage output application. Similarly, the tri-state buffer circuit 300B represents a simplified repeater circuit suitable for use in a unidirectional full swing voltage input/full swing voltage output applications. The buffer enable signal EN__A can optionally be coupled to input stage 302A to control transistors therein, which pass the full swing input signal on conductor 308 of port B to the control stage 304A. As will be shown later herein, the buffer enable signal EN__A is also employed in some embodiments to control the passage of signals within control stage 304A and/or the output stage 306A. Within control stage 304A, transistors therein generate control signals in the same full swing range. These control signals are passed on to output stage 306A, where the full swing voltages corresponding to full swing voltages received on port B can be outputted by output stage 306A on port A.

Similarly, the tri-state buffer circuit 300B represents a repeater circuit suitable for use in unidirectional full swing voltage input/full swing voltage output applications. The buffer enable signal EN__B can optionally be coupled to input stage 302B to control transistors therein, which pass the full swing voltage input signal on conductor 310 of port A to the control stage 304B. The buffer enable signal EN__B may also be employed to control the passage of signals within control stage 304B and/or the output stage 306B. Within control stage 304B, transistors therein generate control signals in the same full swing range. These control signals are passed on to output stage 306B, where the full swing voltages corresponding to full swing voltages received on Port A can be outputted by output stage 306B on Port B.

In this manner, a full swing voltage input/full swing voltage output bi-directional repeater can be employed between two nodes with full swing voltage ranges to facilitate propagation of signals between the nodes in both directions. As it would be well understood by those skilled in the art, a full swing voltage unidirectional repeater (such as components 300A or 300B) that makes up a full swing voltage bi-directional repeater (such as circuit 300) may be used alone to facilitate propagation of signals in a single direction.

Figure 4:
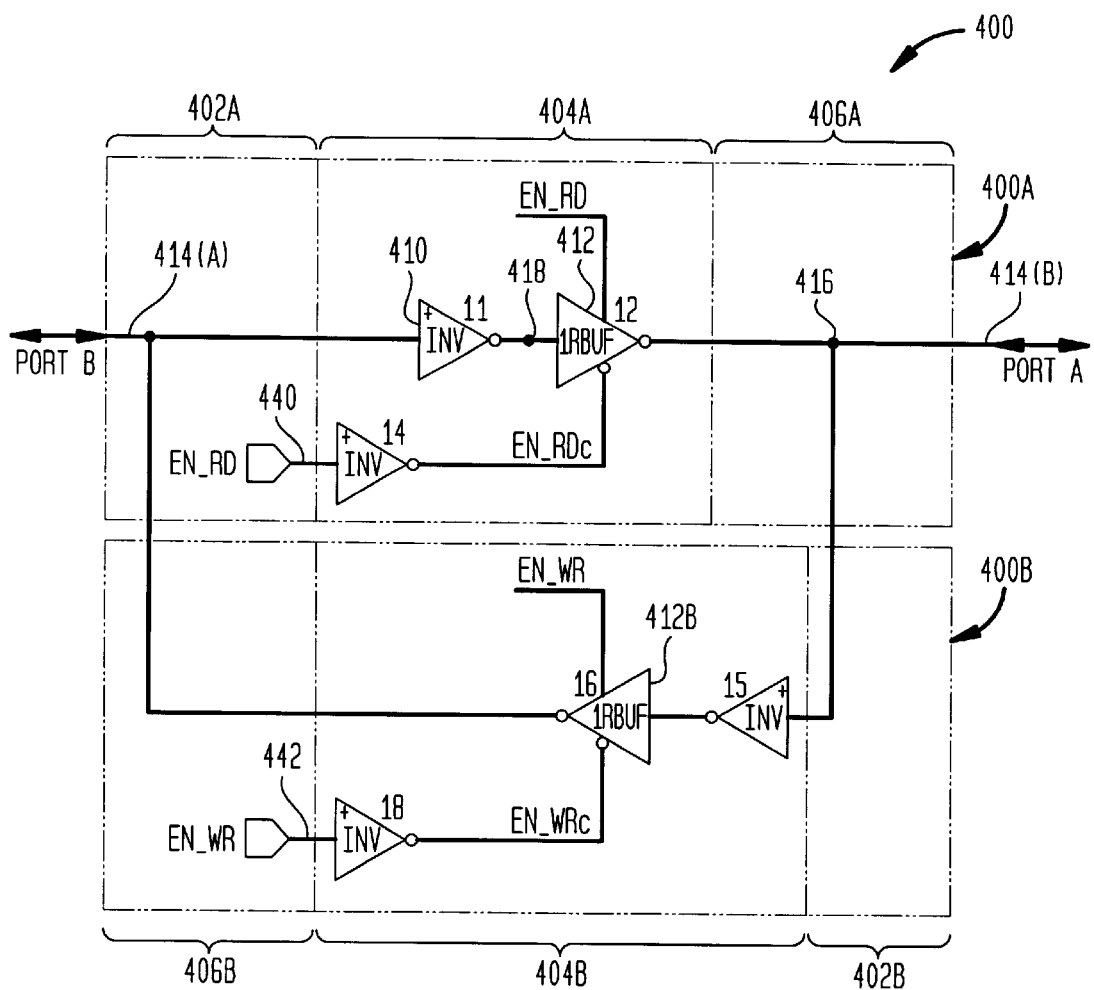
FIG. 4 illustrates, in greater detail and in accordance with one embodiment of the present invention, a full swing voltage bi-directional tri-state buffer circuit, capable of functioning as a full swing voltage bi-directional repeater circuit.

FIG. 4 illustrates, in greater detail and in accordance with one embodiment of the present invention, a bi-directional full swing voltage repeater circuit 400 that includes two unidirectional full swing voltage repeaters circuits 400A and 400B. Circuit 400A represents a non-inverting tri-state buffer capable of accepting a full swing voltage input and driving a load with its full swing voltage output to function as a unidirectional full swing repeater or a building block of a bidirectional full swing repeater. Similarly, circuit 400B represents a non-inverting tri-state buffer capable of accepting a full swing voltage input and driving a load with its full voltage output to function as a full swing voltage unidirectional repeater or a building block of a full swing voltage bi-directional repeater. As shown in FIG. 4, the output of tri-state buffer 400A is coupled to the input of tri-state buffer 400B, forming port A. Likewise, the output of tri-state buffer 400A is coupled to the input of tri-state buffer 400B, forming port B.

In operation, when control signal EN__RD is enabled (e.g. logical high), bi-directional tri-state buffer 400A functions as a unidirectional repeater which receives a full swing voltage signal from Port B and outputs the corresponding full swing voltage signal at Port A. At the same time, control signal EN__WR would be low (When EN-RD is high) essentially tri-stating buffer circuit 400B and decoupling it from Port B. When EN__RD is high, the entire bidirectional repeater circuit of FIG. 4 functions as a unidirectional repeater which passes a full swing voltage input signal from Port B to Port A (i.e., left to right of FIG. 4).

In the reverse direction, in an analogous manner when control signal EN__WR is high, tri-state buffer 400B functions as a unidirectional repeater which receives a full swing voltage signal from port A and outputs the corresponding full swing voltage signal at port B. In this situation, control signal EN__RD would be low, essentially tri-stating buffer circuit 400A and decoupled from port A and/or port B. In general, the enable signals EN__RD and EN__WR are preferably valid before the data arrives at the repeater to prevent signal transmission delay.

Buffer circuit 400A includes a combined input/control/output stage. A full swing voltage input signal is received at buffer input node 408 and passed to control. The combined input/control/output stage 404A includes an inverter 410 and a tri-state inverter 412 whose gates are controlled by the buffer enable signal EN__RD and its complement EN__RDc.

When buffer enable signal EN-RD is enabled, depending on the input, output stage 406A outputs either a logical low ($V_{SS}$) or a logical high (the high value of the Full swing range, or $V_{DD}$ herein). Buffer circuit 400B is symmetrical both in structure and function with respect to circuit 400A and its operation would readily be known to those skilled in the in view of the disclosure with respect to circuit 400A.

It should be noted that although both buffer circuits 400A and 400B are configured as non-inverting tri-state buffer circuits, such is not a requirement. Accordingly, the inventions herein are not necessarily limited to the inverting (or non-inverting) feature of the full swing voltage tri-state buffer circuits. In addition, although for ease of illustration, all the enable signals in FIG. 4 and the following figures are shown as EN__RD and EN__WR, (suggesting RWD application) it should be understood that the inventions herein can also be applied to other applications and the inventions herein are not necessarily limited to bi-directional RWD lines.

To facilitate further understanding, the operation of full swing bi-directional repeater 400 will now be explained in detail. Consider the situation wherein both buffer enable signals EN__RD and EN__WR are disabled to permit tri-state buffers 400A and 400B to enter the tri-state mode. In the circuit of 400A, the tri-state mode is entered when signal EN_RD is low. With low signal EN_RD, tri-state inverter 412 would be tri-stated, thereby preventing the signal at input node 414 from being outputted by output stage 406A. Similarly When EN_WR is disabled, a tri-state inverter 412B would be tri-stated, thereby preventing the signal at input node 416 from being outputted.

Note that both tri-state inverters 412 and 412B are operated with an upper power level equal to $V_{DD}$. As the term is employed herein, $V_{DD}$ represents the voltage level at which the majority of peripheral circuit of the integrated circuit operates, which may be equal to or lower than the voltage level supplied to the integrated circuit from externally.

When buffer circuit 400A is not tri-stated, (signal EN_RD is enabled) consider the situation where a $V_{SS}$ (logical low) voltage level appears on input node 408. Inverter 410 would invert the input value and output it as $V_{DD}$ (logical high) at node 418. Since logical high signal EN_RD enables the tri-state inverter 412, $V_{DD}$ at node 418 would be outputted as a $V_{SS}$ by the inverting action of the tri-state inverter 412. Thus, a $V_{SS}$ corresponding to an input $V_{SS}$ voltage at node 408 would be outputted at node 416. It should be noted that when enable control signal EN_RD is a logical high, control signal EN_WR is a logical low. In this situation buffer circuit 400B is tri-stated and buffer circuit 400A operates as discussed above.

Now consider the situation where a $V_{DD}$ (logical high) voltage level appears on input node 408 and buffer circuit 400A is not tri-stated (signal EN_RD is enabled). Inverter 410 would invert the input value and output it as $V_{SS}$ (logical low) at node 418. Since logical high signal EN_RD enables the tri-state inverter 412, $V_{SS}$ at node 418 would be outputted as a $V_{DD}$ by the inverting action of the tri-state inverter 412. Thus, a $V_{DD}$ corresponding to an input $V_{DD}$ voltage at node 408 would be outputted at node 416. Again, It should be noted that when enable control signal EN_RD is a logical high, control signal EN_WR is a logical low. In this situation buffer circuit 400B is tri-stated and buffer circuit 400A operates as discussed above.

In the reverse direction (from node 416 to node 408) when EN_WR control signal is enabled (EN_RD is disabled) circuit 400B can operate in the similar manner as circuit 400A discussed above. Since circuit 400B is completely symmetrical to circuit 400A, its operation would readily be known to those skilled in the art in view of this disclosure.

Figure 5:
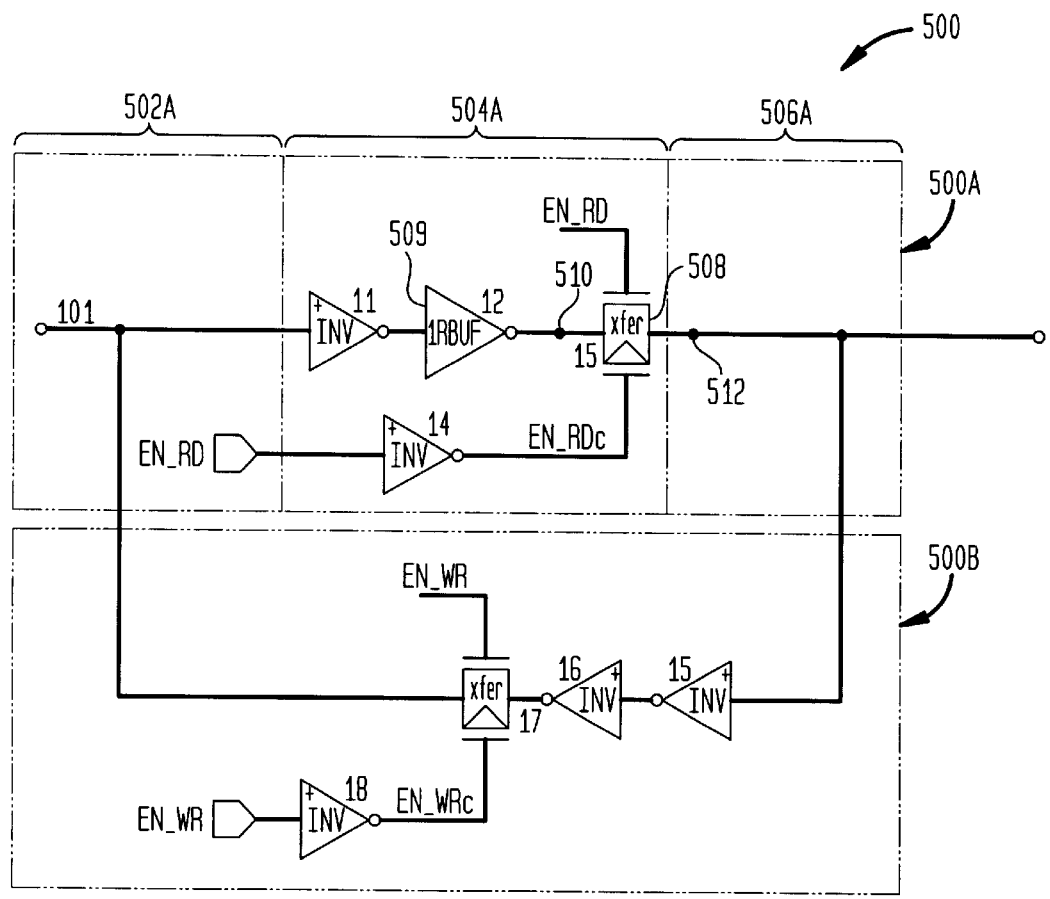
FIGS. 5–7 illustrate, in accordance with various embodiments of the present invention, various alternative configurations of a full swing voltage bi-directional tri-state buffer circuit, capable of functioning as a full swing voltage bi-directional repeater circuit.
Figure 6:
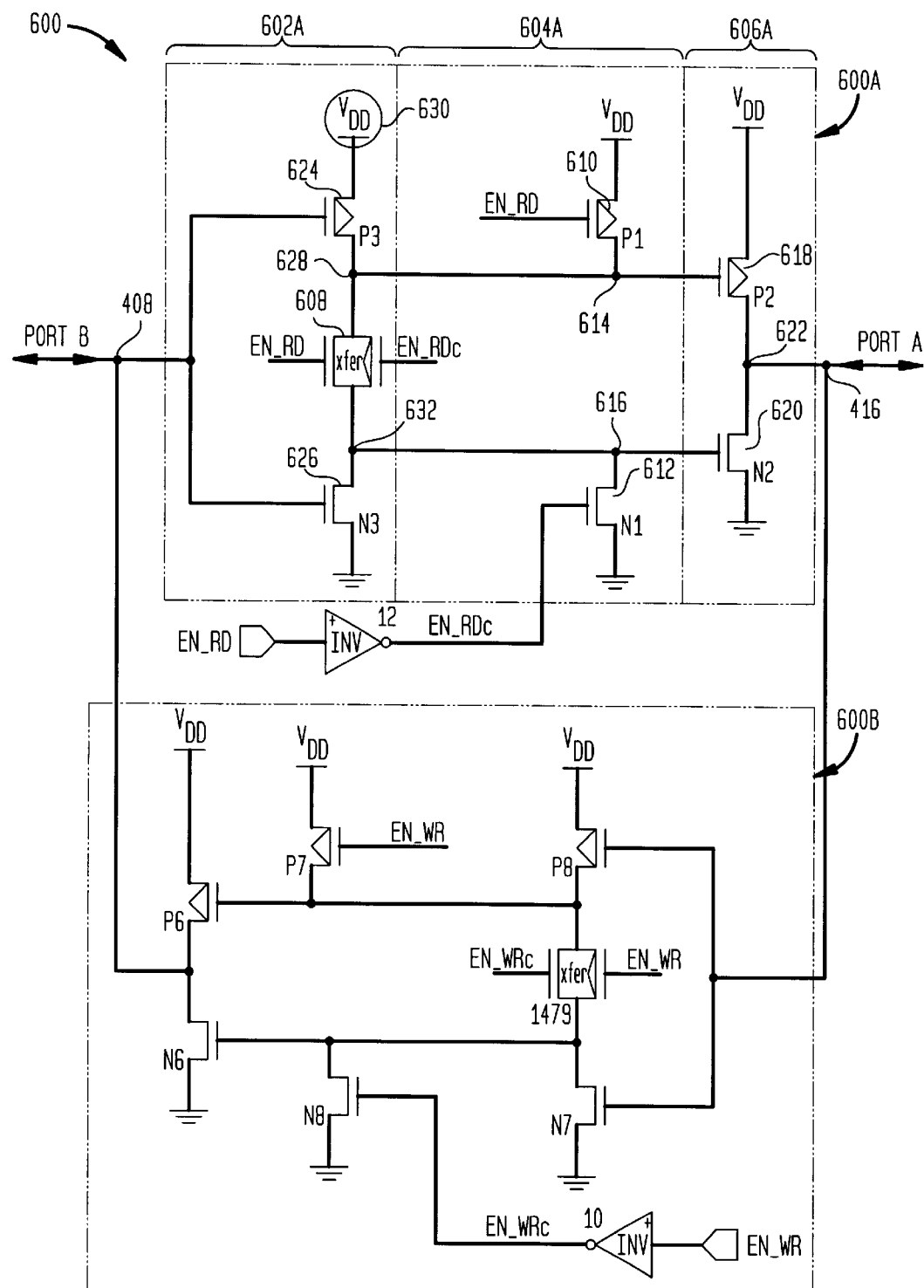
Figure 7:
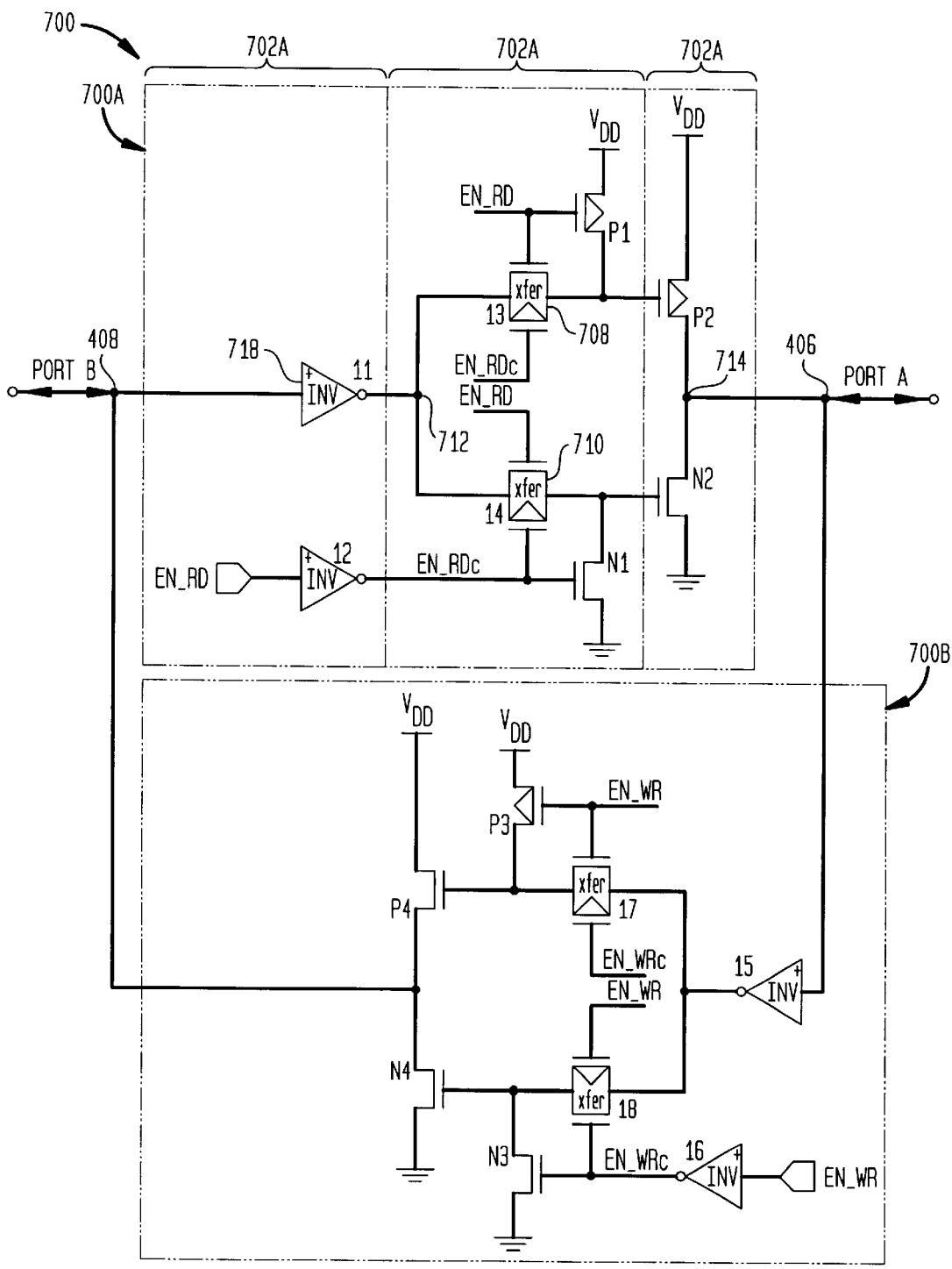

FIGS. 5–7 depict various alternative embodiments for full swing voltage bi-directional repeater circuits, showing the various exemplary manners in which input, control, and output stages may be configured for each bi-directional repeater circuit. One of ordinary skills in the art will readily appreciate that any of the exemplary embodiments discussed in these figures may be employed as a bi-directional repeater stage (e.g., for RWD lines in DRAMs and/or other loaded bi-directional signal carrying conductors in integrated circuits).

In FIGS. 5–7, each full swing voltage bi-directional repeater circuit includes two symmetrical (both in terms of structure and function) full swing voltage unidirectional repeater circuits, one depicted at the top and one depicted at the bottom of each figure. In FIG. 5, the combined input/control/output control stage of a unidirectional repeater circuit 500A includes a transmission gate 508 and an inverter 509 instead of a tri-state inverter (such as 412 as in the case of FIG. 4). Transmission gate 508 functions to pass the voltage between nodes 510 and node 512, responsive to control signal EN_RD and its complement EN_RDc. The remainder of the circuit of FIG. 5 functions in an analogous manner to the circuit of FIG. 4, and the operation of the buffer of FIG. 5 is readily understandable to one skilled in the art in view of this disclosure.

FIG. 6 illustrates, in greater detail and in accordance with yet another embodiment of the present invention, a bi-directional full swing voltage repeater circuit 600. A full swing voltage input signal is received at buffer input node 408. In this particular implementation, the input stage 602A includes a transmission gate 608 that can pass the voltages received from node 408 responsive to enable control signal EN_RD and it complement EN_RDc. EN_RD enable control signal is additionally utilized to tri-state buffer 600A. As shown in FIG. 6, both input and output stages of circuit 600 are implemented by connecting two FET's in series between a $V_{DD}$ and $V_{SS}$ voltage sources.

To facilitate further understanding, the operation of full swing bi-directional repeater 600 will now be explained in greater detail. Consider the situation wherein both buffer enable signals EN_RD and EN_WR are disabled to permit tri-state buffers 600A and 600B to enter the tri-state mode. In the circuit of 600A, the tri-state mode is entered when signal EN_RD is low. With low signal EN_RD, transmission gate 608 would be disabled, thereby preventing the signal at input node 408 from reaching node 614. In addition, both FET's 610 and 612 would be on when EN_RD is low to put a $V_{DD}$ and a $V_{SS}$ on nodes 614 and 616 respectively (when p-FET 610 is on node 614 would be pulled to $V_{DD}$ and when n-FET 612 is on node 616 would be pulled to $V_{SS}$). In this situation, both FET's 618 and 620 would be off to put node 622 in state of high impedance with respect to node 416 (p-FET 618 would have a logical high at its gate and n-FET 620 would have a logical low at its gate). Similarly, when EN_WR is disabled, circuit 600B which is completely symmetrical to circuit 600A function in a similar manner to tri-state circuit 600B.

When buffer circuit 600A is not tri-stated, (signal EN_RD is enabled) consider the situation where a $V_{SS}$ (logical low) voltage level appears on node 408. With a high EN_RD, transmission gate 608 would be enabled to pass the voltages to node 616. In this case, when a $V_{SS}$ is placed on node 408, with the transmission gate 608 enabled, p-FET 624 would be on and n-FET 626 would be off. When p-FET 624 is on, node 628 would be pulled by the voltage source 630 to $V_{DD}$. This would put a $V_{DD}$ on node 614 that turns p_FET 618 off. However, in this situation node 616 would have a $V_{DD}$ (when transmission gate 608 is enabled and p-FET 624 is on, both nodes 628 and 616 would be pulled to $V_{DD}$). A $V_{DD}$ on node 616 would turn on FET 620 to connect node 622 to $V_{SS}$. Thereby, a $V_{SS}$ corresponding to the $V_{SS}$ received at node 408 would be outputted on node 416.

Now consider the situation where a $V_{DD}$ (logical high) voltage level appears on input node 408 and buffer circuit 600A is not tri-stated (signal EN_RD is enabled). With a high EN_RD, transmission gate 608 would be enabled to pass the voltages to nodes 614 and 616. In this case, when a $V_{DD}$ is placed on node 408, with the transmission gate 608 enabled, p-FET 624 would be off and n-FET 626 would be on. When n-FET 626 is on, node 616 would be pulled to $V_{SS}$ to place a $V_{SS}$ on node 616 which in turn shuts off n-FET 620. However, in this situation node 614 would also be pulled to $V_{SS}$ (when transmission gate 608 is enabled and p-FET 626 is on, both nodes 628 and 614 are pulled to $V_{SS}$). A $V_{SS}$ on node 614 would turn on p-FET 618 to connect node 622 to $V_{DD}$. Thereby, a $V_{DD}$ corresponding to the $V_{DD}$ received at node 408 would be outputted on node 416. Circuit 600B is completely symmetrical to circuit 600A and it operations would be readily known to those skilled in the art in view of this disclosure.

In FIG. 7, the control stage 704A of the unidirectional repeater circuit 700A includes two transmission gates 708 and 710 that are implemented between nodes 712 and 714. Transmission gates 718 and 710 can pass voltages between nodes 712 and 714, responsive to control signal EN_RD and its complement. In this particular embodiment, the input stage 702A is implemented by an inverter 718 that inverts the input values at node 408 and outputs the inverted values to control stage 704A. Control stage 704A can pass input voltages responsive to EN_RD signal and its complement. The remainder of the circuit 700A functions roughly in the same manner as the circuit in 600A and it operations would be readily known to those skilled in the art in the view of this disclosure.

In the reverse direction (from node 416 to node 408) when EN_WR control signal is enabled (EN_RD is disabled) circuit 700B can operate in the similar manner as circuit 700A discussed above. Since circuit 700B is completely symmetrical to circuit 700A, its operation would readily be known to those skilled in the art in view of this disclosure.

Any of the buffers disclosed herein may be employed as full swing bi-directional repeater to reduce, among others, the propagation delay as well as signal degradation associated with high capacitance and/or high resistance associated with bidirectional signal lines.

As it would be appreciated by those skilled in the art, circuits 600 and 700 would be more suitable for applications with relatively heavier loads. By the same token, circuit 400 and 500 may be used in cases where relatively lighter loads are encountered.

Figure 8:
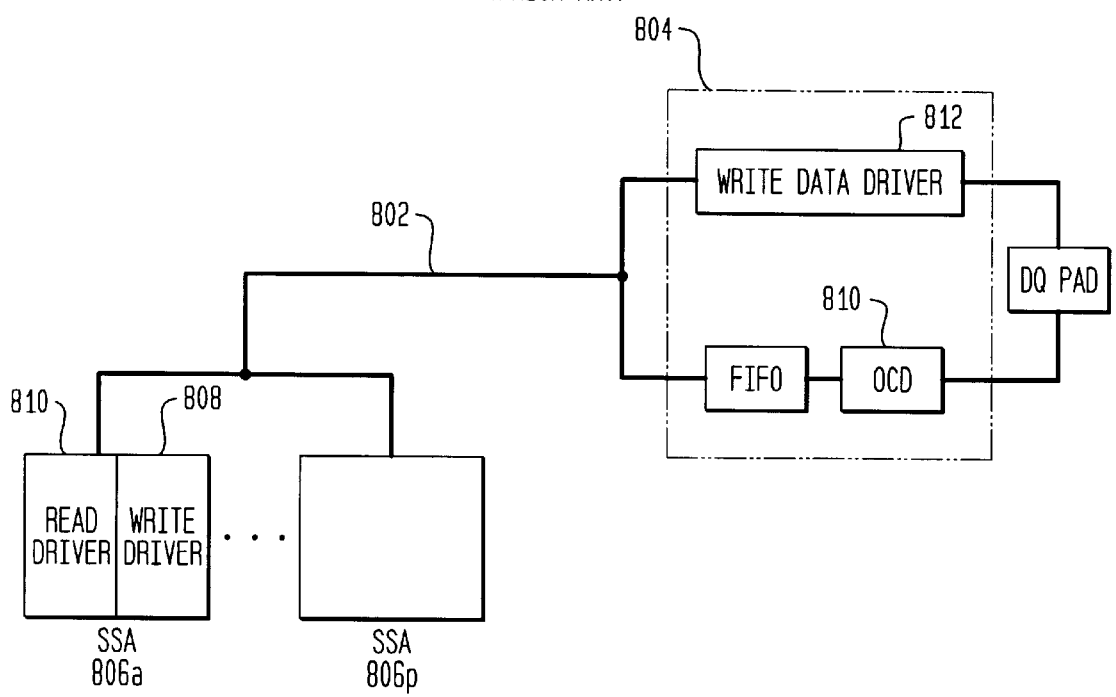
FIG. 8 illustrates, to facilitate discussion, a diagrammatic representation of an exemplary DRAM architecture, including a RWD line.

To facilitate discussion of the application of the bi-directional repeater of the present invention in a modern high density integrated circuit, FIG. 8 illustrates, a diagrammatic representation of an exemplary DRAM architecture, which shows a RWD line 802 coupled to a driver/receiver pair 804 and to each of the sixteen driver/receiver pairs 806(a)–(p). In this example, each of driver/receiver pairs 806(a)–(p) represents the driver/receiver pair associated with a second sense amplifier, i.e., the sense amplifier that is employed to further amplify the signal from a cell after that signal has been amplified once by a first sense amplifier.

Data lines represent the data to be read from or written to the cells, or more specifically to the first sense amplifier associated with the cell depending on the state of the signals that control drivers 808 and 810 associated with each of these driver/receiver pairs 806. If data is to be written to the cell that is coupled to a data line, for example, the bit of data may be received by driver/receiver pair 804 and driven onto RWD line 802. Driver 804 (or more specifically driver 812 therein) is turned on to pass the data onto a data line to be written to the cell. If data is to be read from the cell that is coupled to a data line, for example, the bit of data may be received by driver/receiver pair 806(a) and driven onto RWD line 802. Driver/receiver pair 804 (or more specifically driver 810 therein) is turned on to pass the data from a data line to a FIFO or off-chip driver circuit.

As can be seen, RWD line 802 is a bi-directional line that is employed to pass data from off chip to one of the cells or from one of the cells to a FIFO or off-chip driver circuit and ultimately off chip. With reference to FIG. 8, each driver/ receiver pair 806 has associated with it a capacitor, representing the capacitive load of that driver/receiver pair 806 as seen from RWD line 802 and includes the input capacitance of driver 808 as well as the output capacitance of driver 810. RWD line 802 then has a capacitive load distributed along its length that includes the capacitance associated with each of the driver/receiver pair 806 as well as the capacitance of the RWD line itself. Furthermore, RWD line 802 is a long signal line and tends to have a significant resistance along its length, particularly between driver/receiver pair 806 (such as driver/receiver pair 806(p)) and driver/receiver pair 804. The large resistance and capacitance associated with RWD line 802 degrades performance both when writing to a cell and when reading therefrom.

Figure 9:
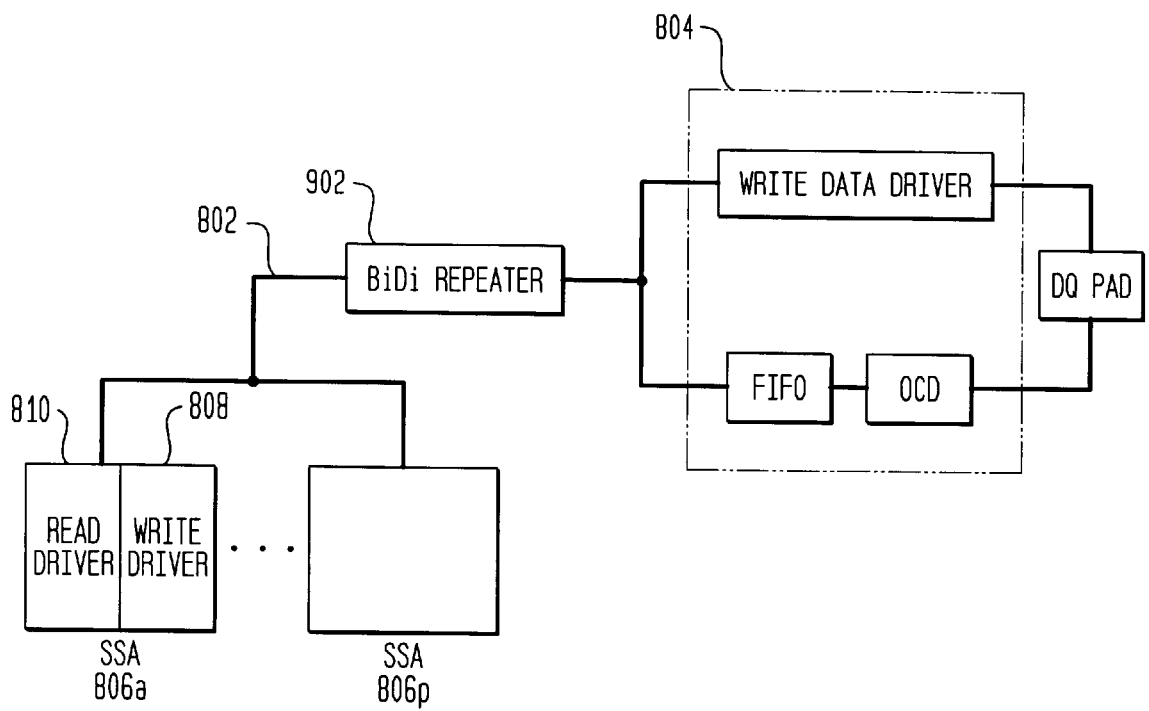
FIG. 9 illustrates, a diagrammatic representation of the DRAM architecture of FIG. 8, including a bidirectional repeater implemented on the RWD line in accordance with one embodiment of the present invention.

FIG. 9 shows, in accordance with one embodiment of the present invention, the DRAM circuit portion of FIG. 8, including a bi-directional repeater 902 disposed in between driver/receiver pair 804 and the driver/receiver pairs of the cell array.

Bi-directional repeater 902 is preferably disposed such that it is positioned on RWD line 802 between driver/ receiver pair 804 and all driver/receiver pairs 806. That is, it is preferable that any data written to or read from a driver/receiver pair 806 via the RWD line traverses the bi-directional repeater. When so disposed, bi-directional repeater 902 serves to decouple a portion of the capacitance associated with RWD line 802 to improve performance during reading and writing. Further, the presence of bi-directional repeater 902 reduces the amount of resistance seen by driver 810 of driver/receiver pair 806 when reading data and reduces the amount of resistance seen by driver 812 of driver/receiver pair 804 when writing data to the cell.

In view of the foregoing, the use of the repeater of the present invention advantageously reduces the propagation delay associated with high capacitance, high resistance load lines. Furthermore, the use of the repeater of the present invention at strategic locations on the high capacitive load, high resistance lines advantageously improves signaling, i.e., improving the rise and fall edges to counteract the attenuation effects and/or propagation delay of the signal line. The improvement of the rise and fall times is essential to realize high bandwidth data transfer. Without this improvement, the timing window for which the transmitted data is valid is full and consequently the frequency at which the bus can be run is limited.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A bi-directional full swing voltage repeater implemented on a signal line of an integrated circuit, comprising:
   a first enable node for providing a first enable signal;
   a second enable node for providing a second enable signal;
   a first full-swing unidirectional repeater circuit coupled between a first portion of said signal line and a second portion of said signal line, said first full-swing unidirectional repeater being configured to pass a first full swing signal from said first portion of said signal line to said second portion of said signal line when said first enable signal is enabled;
   a second full-swing unidirectional repeater circuit coupled between said first portion of said signal line and said second portion of said signal line, said second full-swing unidirectional repeater circuit being configured to pass a second full swing signal from said second portion of said signal line to said first portion of said signal line when said second enable signal is enabled, wherein said first full-swing unidirectional repeater circuit and said second full-swing unidirectional repeater circuit are tri-stated when both said first enable signal and said second enable signal are disabled;

wherein said first full-swing unidirectional repeater circuit includes:

a first inverter coupled to said first portion of said signal line;

a first inverting tri-state buffer coupled to receive an output of said first inverter, said first inverting tri-state buffer being configured to be enabled when said first enable signal is enabled, said first inverting tri-state buffer being configured to be tri-stated when said first enable signal is disabled, an output of said first inverting tri-state buffer being coupled to said second portion of said signal line.

2. The bidirectional full swing voltage repeater of claim 1 wherein said second full-swing unidirectional repeater circuit includes a second inverter coupled to said second portion of said signal line;

a second inverting tri-state buffer coupled to receive an output of said second inverter, said second inverting tri-state buffer being configured to be enabled when said second enable signal is enabled, said second inverting tri-state buffer being configured to be tri-stated when said second enable signal is disabled, an output of said second inverting tri-state buffer being coupled to said first portion of said signal line.

3. The bidirectional full swing voltage repeater of claim 2 wherein said first inverter, said second inverter, said first inverting tri-state buffer, and said second inverting tri-state buffer operate on a full-swing voltage level.

4. A bi-directional full swing voltage repeater implemented on a signal line of an integrated circuit, comprising:

a first enable node for providing a first enable signal;

a second enable node for providing a second enable signal;

a first full-swing unidirectional repeater circuit coupled between a first portion of said signal line and a second portion of said signal line, said first full-swing unidirectional repeater being configured to pass a first full swing signal from said first portion of said signal line to said second portion of said signal line when said first enable signal is enabled;

a second full-swing unidirectional repeater circuit coupled between said first portion of said signal line and said second portion of said signal line, said second full-swing unidirectional repeater circuit being configured to pass a second full swing signal from said second portion of said signal line to said first portion of said signal line when said second enable signal is enabled, wherein said first full-swing unidirectional repeater circuit and said second full-swing unidirectional repeater circuit are tri-stated when both said first enable signal and said second enable signal are disabled;

wherein said first full-swing unidirectional repeater circuit includes a first inverter coupled to said first portion of said signal line;

a second inverter coupled to receive an output of said first inverter;

a first transmission gate coupled to receive an output of said second inverter, said first inverting tri-state buffer being configured to be enabled when said first enable signal is enabled, said first inverting tri-state buffer being configured to be disabled when said first enable signal is disabled, an output of said first transmission gate being coupled to said second portion of said signal line.

5. The bidirectional full swing voltage repeater of claim 4 wherein said second full-swing unidirectional repeater circuit includes a third inverter coupled to said second portion of said signal line;

a fourth inverter coupled to receive an output of said third inverter;

a second transmission gate coupled to receive an output of said fourth inverter, said second transmission gate being configured to be enabled when said second enable signal is enabled, said second transmission gate being configured to be disabled when said second enable signal is disabled, an output of said second transmission gate being coupled to said first portion of said signal line.

6. The bidirectional full swing voltage repeater of claim 5 wherein said first inverter, said second inverter, said third inverter, said fourth inverter, said first transmission gate, and said second transmission gate operate on a full-swing voltage level.

7. A bi-directional full swing voltage repeater implemented on a signal line of an integrated circuit, comprising:

a first enable node for providing a first enable signal;

a second enable node for providing a second enable signal;

a first full-swing unidirectional repeater circuit coupled between a first portion of said signal line and a second portion of said signal line, said first full-swing unidirectional repeater being configured to pass a first full swing signal from said first portion of said signal line to said second portion of said signal line when said first enable signal is enabled;

a second full-swing unidirectional repeater circuit coupled between said first portion of said signal line and said second portion of said signal line, said second full-swing unidirectional repeater circuit being configured to pass a second full swing signal from said second portion of said signal line to said first portion of said signal line when said second enable signal is enabled, wherein said first full-swing unidirectional repeater circuit and said second full-swing unidirectional repeater circuit are tri-stated when both said first enable signal and said second enable signal are disabled;

wherein said first full-swing unidirectional repeater circuit includes a first p-type FET having a first p-type FET gate, a first p-type FET drain, and a first p-type FET source, said first p-type FET gate being coupled to said first portion of said signal line, one of said first p-type FET drain and said p-type FET source being coupled to a full-swing voltage source, another one of said first p-type FET drain and said p-type FET source being coupled to a first node;

a first n-type FET having a first n-type FET gate, a first n-type FET drain, and a first n-type FET source, said first n-type FET gate being coupled to said first portion of said signal line, one of said first n-type FET drain and said first n-type FET source being coupled to a Vss source, another one of said first n-type FET drain and said n-type FET source being coupled to a second node;

a transmission gate coupled between said first node and said second node, said transmission gate is configured to be enabled when said first enable signal is enabled, said first transmission gate is configured to be disabled when said first enable signal is disabled;

a second p-type FET having a second p-type FET gate, a second p-type FET drain, and a second p-type FET source, said second p-type FET gate being coupled to said first node, one of said second p-type FET drain and said p-type FET source being coupled to said full-swing voltage source, another one of said second p-type FET drain and said p-type FET source being coupled to said second portion of said signal line; and a second n-type FET having a second n-type FET gate, a second n-type FET drain, and a second n-type FET source, said second n-type FET gate being coupled to said second node, one of said second n-type FET drain and said second n-type FET source being coupled to said Vss source, another one of said second n-type FET drain and said n-type FET source being coupled to said second portion of said signal line.

8. The bidirectional full swing voltage repeater of claim 7 further comprising:

a third p-type FET having a third p-type FET gate, a third p-type FET drain, and a third p-type FET source, said third p-type FET gate being coupled to said first enable node, one of said third p-type FET drain and said p-type FET source being coupled to said full-swing voltage source, another one of said third p-type FET drain and said p-type FET source being coupled to said second node;

a third n-type FET having a third n-type FET gate, a third n-type FET drain, and a third n-type FET source, said third n-type FET gate being coupled to a signal that is complement of said first enable signal, one of said third n-type FET drain and said third n-type FET source being coupled to said Vss source, another one of said third n-type FET drain and said n-type FET source being coupled to said second node.

9. A bi-directional full swing voltage repeater implemented on a signal line of an integrated circuit, comprising:

a first enable node for providing a first enable signal;

a second enable node for providing a second enable signal;

a first full-swing unidirectional repeater circuit coupled between a first portion of said signal line and a second portion of said signal line, said first full-swing unidirectional repeater being configured to pass a first full swing signal from said first portion of said signal line to said second portion of said signal line when said first enable signal is enabled;

a second full-swing unidirectional repeater circuit coupled between said first portion of said signal line and said second portion of said signal line, said second full-swing unidirectional repeater circuit being configured to pass a second full swing signal from said second portion of said signal line to said first portion of said signal line when said second enable signal is enabled, wherein said first full-swing unidirectional repeater circuit and said second full-swing unidirectional repeater circuit are tri-stated when both said first enable signal and said second enable signal are disabled;

wherein said first full-swing unidirectional repeater circuit includes a first inverter having a first inverter input and a first inverter output, said first inverter input being coupled to said first portion of said signal line;

a first transmission gate having a first transmission gate terminal and a second transmission gate terminal, said first transmission gate terminal being coupled to said first inverter output, said first transmission gate being coupled to said first inverter output, said first transmission gate is configured to be enabled when said first enable signal is enabled, said first transmission gate is configured to be disabled when said first enable signal is disabled;

a second transmission gate having a third transmission gate terminal and a fourth transmission gate terminal, said third transmission gate terminal being coupled to said first inverter output, said first transmission gate being coupled to said first inverter output, said second transmission gate is configured to be enabled when said first enable signal is enabled, said second transmission gate is configured to be disabled when said first enable signal is disabled;

a first p-type FET having a first p-type FET gate, a first p-type FET drain, and a first p-type FET source, said first p-type FET gate being coupled to said second transmission gate terminal, one of said first p-type FET drain and said p-type FET source being coupled to a full-swing voltage source, another one of said first p-type FET drain and said p-type FET source being coupled to said second portion of said signal line; and a first n-type FET having a first n-type FET gate, a first n-type FET drain, and a first n-type FET source, said first n-type FET gate being coupled to said fourth transmission terminal, one of said first n-type FET drain and said first n-type FET source being coupled to a Vss source, another one of said first n-type FET drain and said n-type FET source being coupled to said second portion of said signal line.

10. The bidirectional full swing voltage repeater of claim 9 further comprising:

a third p-type FET having a third p-type FET gate, a third p-type FET drain, and a third p-type FET source, said third p-type FET gate being coupled to said first enable node, one of said third p-type FET drain and said p-type FET source being coupled to said full-swing voltage source, another one of said third p-type FET drain and said p-type FET source being coupled to said second transmission terminal;

a third n-type FET having a third n-type FET gate, a third n-type FET drain, and a third n-type FET source, said third n-type FET gate being coupled to a signal that is complement of said first enable signal, one of said third n-type FET drain and said third n-type FET source being coupled to said Vss source, another one of said third n-type FET drain and said n-type FET source being coupled to said fourth transmission terminal.

11. A memory integrated circuit having therein a bi-directional full swing voltage repeater implemented on a bi-directional data signal line, said memory integrated circuit comprising:

a first enable node for providing a first enable signal;

a second enable node for providing a second enable signal;

a bi-directional data signal lines disposed on the memory integrated circuit;

a first full-swing unidirectional repeater circuit coupled between a first portion of said bi-directional data signal line and a second portion of said bi-directional data signal line, said first full-swing unidirectional repeater being configured to pass a first full swing signal from said first portion of said bi-directional data signal line to said second portion of said bi-directional data signal line when said first enable signal is enabled; and a second full-swing unidirectional repeater circuit coupled between said first portion of said bi-directional data signal line and said second portion of said bidirectional data signal line, said second full-swing unidirectional repeater circuit being configured to pass a second full swing signal from said second portion of said bidirectional data signal line to said first portion of said bi-directional data signal line when said second enable signal is enabled;

wherein said first full-swing unidirectional repeater circuit and said second full-swing unidirectional repeater circuit are tri-stated when both said first enable signal and said second enable signal are disabled, said first full swing unidirectional repeater circuit being tristated when said second enable signal is enabled, and said second full swing unidirectional repeater circuit being tristated when said first enable signal is enabled; and wherein said first full-swing unidirectional repeater circuit includes a first inverter coupled to said first portion of said bi-directional data signal line, and a first inverting tri-state buffer coupled to receive an output of said first inverter, said first inverting tri-state buffer being configured to be enabled when said first enable signal is enabled, said first inverting tri-state buffer being configured to be tri-stated when said first enable signal is disabled, an output of said first inverting tri-state buffer being coupled to said second portion of said bi-directional data signal line.

12. The memory integrated circuit of claim 11 wherein said memory integrated circuit is a dynamic random access memory circuit (DRAM) and said bidirectional data signal line represents a bi-directional RWD line.

13. The memory integrated circuit of claim 11 wherein said integrated circuit is a dynamic random access memory circuit (DRAM) and said bidirectional data signal line is disposed between a first driver/receiver pair and a second driver/receiver pair.

14. The memory integrated circuit of claim 11 wherein said second full-swing unidirectional repeater circuit includes a second inverter coupled to said second portion of said bi-directional data signal line;

a second inverting tri-state buffer coupled to receive an output of said second inverter, said second inverting tri-state buffer being configured to be enabled when said second enable signal is enabled, said second inverting tri-state buffer being configured to be tri-stated when said second enable signal is disabled, an output of said second inverting tri-state buffer being coupled to said first portion of said bi-directional data signal line.

15. The memory integrated circuit of claim 14 wherein said first inverter, said second inverter, said first inverting tri-state buffer, and said second inverting tri-state buffer operate on a full-swing voltage level.

16. A method for implementing a bi-directional full swing voltage repeater on a signal line of an integrated circuit, comprising:

providing a first enable node, said first enable node being configured for providing a first enable signal;

providing a second enable node, said second enable node being configured for providing a second enable signal;

providing a first full-swing unidirectional repeater circuit coupled between a first portion of said signal line and a second portion of said signal line, said signal line being disposed on the integrated circuit, said first full-swing unidirectional repeater being configured to pass a first full swing signal from said first portion of said signal line to said second portion of said signal line when said first enable signal is enabled, wherein said first full-swing unidirectional repeater circuit includes a first inverter coupled to said first portion of said signal line, and a first inverting tri-state buffer coupled to receive an output of said first inverter, said first inverting tri-state buffer being configured to be enabled when said first enable signal is enabled, said first inverting tri-state buffer being configured to be tri-stated when said first enable signal is disabled, an output of said first inverting tri-state buffer being coupled to said second portion of said signal line;

providing a second full-swing unidirectional repeater circuit coupled between said first portion of said signal line and said second portion of said signal line, said second full-swing unidirectional repeater circuit being configured to pass a second full swing signal from said second portion of said signal line to said first portion of said signal line when said second enable signal is enabled, wherein said first full-swing unidirectional repeater circuit and said second full-swing unidirectional repeater circuit are tri-stated when both said first enable signal and said second enable signal are disabled.

17. The method of claim 16 wherein said signal line represents a high capacitance signal line in said integrated circuit.

18. The method of claim 16 wherein said integrated circuit is a memory integrated circuit and said signal line represents a data line for reading data from and writing data to a memory cell.

19. The method of claim 16 wherein said integrated circuit is a dynamic random access memory circuit (DRAM) and said signal line represents a bidirectional RWD line.

20. The method of claim 16 wherein said integrated circuit is a dynamic random access memory circuit (DRAM) and said signal line is disposed between a first driver/receiver pair and a second driver/receiver pair.

* * * * *